June 2, 1970 G. KOHN 3,516,021

FIELD EFFECT TRANSISTOR MICROWAVE GENERATOR

Filed Dec. 5, 1967 3 Sheets-Sheet 1

INVENTOR
GERARD KOHN

BY S. P. Tedesco

ATTORNEY

June 2, 1970 G. KOHN 3,516,021

FIELD EFFECT TRANSISTOR MICROWAVE GENERATOR

Filed Dec. 5, 1967 3 Sheets-Sheet 3

United States Patent Office 3,516,021

Patented June 2, 1970

3,516,021
FIELD EFFECT TRANSISTOR MICROWAVE GENERATOR

Gerhard Kohn, Stuttgart, Germany, assignor to International Business Machines Corporation, Armonk, N.Y., a corporation of New York Filed Dec. 5, 1967, Ser. No. 688,142
Int. Cl. H03b *5/18*
U.S. Cl. 331—117 11 Claims

ABSTRACT OF THE DISCLOSURE

A microwave generator comprises an electric field effect transistor, source and drain electrodes being defined by ohmic contacts and the gate electrode being defined by a Schottky-barrier, or semiconductor-metal diode. A portion of the source electrode is extended to pass over the gate and drain electrodes so as to form input and output transmission lines which are shorted for higher frequencies to define gate and drain resonators, respectively. The length of the drain resonator is $\lambda/2$, where $\lambda$ is the wavelength of the microwave frequency to be generated, and the length of the gate resonator can be slightly shorter, i.e., by $\lambda/8$. The drain and gate resonators are coupled by the transistor structure to support the generation of microwave oscillations.

BACKGROUND OF THE INVENTION

This invention relates to a solid state microwave generator capable of generating microwaves in the millimeter range.

A number of different arrangements for the generation of microwaves are known. Those most frequently used are the so-called transit-time tubes whose different embodiments are known as magnetrons, clystrons, and traveling wave tubes. The principle of controlling these transit-time tubes consists of exposing a steady electron beam to a variable control field which results in changes of the velocity of the electrons. The electrons then accumulate in groups of different density, i.e., a velocity modulation is achieved. The originally steady flow of electrons is converted into pulsed currents. Such tubes require relatively long propagation times of the electrons resulting in costly, complicated and bulky arrangements some of which exhibit only a short lifetime. A further essential disadvantage of such devices lies in the naturally existing high noise signals. Frequencies of up to 100 gigacycles can be reached so that generation of millimeter waves is possible.

Other known microwave generators embody different physical principles. An example is the MASER (Microwave Amplification by Simulated Emission of Radiation) which makes use of atomic and molecular processes, i.e., transitions of ions between different energy levels. The MASER also requires a relatively complicated and bulky arrangement mainly caused by the necessity of supplying the pump energy.

A further example of a microwave generator embodies the so-called Gunn-effect which is a bulk effect occurring, for example, in a small sample of certain semiconductor materials, e.g., GaAs, InP, etc., to which an extremely high electric field is applied.

SUMMARY OF THE INVENTION

The microwave generator of the present invention embodies an entirely different principle. A transmission line amplifier serves as the active element of the generator. Such an amplifier was described in an article "A Traveling Wave Transistor," by G. W. McIver, Proceedings of the IEEE, November 1965, pp. 1747, 1748. The transmission line amplifier described in that publication is actually a development of the well-known distributed amplifier in which the amplification factors of a plurality of active elements arranged in parallel add together. This is accomplished by an arrangement in which the signal input line and the output line form transmission lines of equal phase velocity. The transmission line amplifier described in the article consists of a field effect transistor considerably extended in the direction perpendicular to the current path whose electrodes form the input and output lines. The active elements as well as the elements forming the transmission lines are perfectly distributed over the whole length of the device. In the microwave generator of the present invention, such a transmission line amplifier is employed whose electrodes form resonators, negative coupling between the two resonators acting as a feedback path causing the device to oscillate.

An object of the invention is to provide a simple and very small generator capable of generating microwaves in the millimeter range and operating with high efficiency.

A further object is to provide a microwave generator which may be manufactured by modern production methods as used for the production of transistors and integrated circuits.

These and other objects and advantages of the invention are obtained in a microwave generator consisting of a transmission line amplifier with distributed parameters, whose electrodes form input and output resonators.

The foregoing and other objects, features and advantages of the invention will be apparent from the following more particular description of a preferred embodiment of the invention, as illustrated in the accompanying drawings. The drawings show:

GENERAL DESCRIPTION

To understand the mode of operation of the microwave generator of the present invention, a field effect transistor will be described with the aid of FIG. 1. In principle, a field effect transistor is a variable resistor consisting of a semiconductor sample whose resistance can be controlled by applied control voltages which allow a continuous variation of the geometric dimensions of the current channel. This is accomplished by removing practically all charged carriers within the region of the semiconductor sample close to the contact with the control electrode, the thickness of the depletion zone which reduces the cross-sectional area of the current path depending upon the value of the control voltage. In a borderline case, assuming a sufficiently thin semiconductor sample is used, the whole current channel is almost free of charge carriers and, thus, presents a very high resistance.

Figure 1:
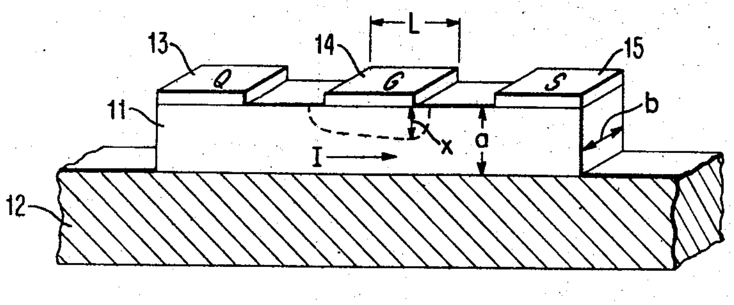
FIG. 1 is a schematic representation of a field effect transistor.

The field effect transistor shown in FIG. 1 consists of an $n$-type semiconductor layer 11 arranged on an insulating substrate 12. Silicon (Si), germanium (Ge), gallium-arsenide (GaAs), and indium-antimonide (InSd) are preferred semiconductor materials. The semiconductor layer 11 is provided with three metal electrodes 13, 14 and 15; electrode 13 serves as source electrode Q, electrode 14 serves as control electrode, or gate, electrode G, and electrode 15 serves as drain electrode S. Electrodes Q and S can be formed of aluminum (Al) and each defines an ohmic contact with the semiconductor layer 11. Electrode G can be, for example, of gold (Au) and defines a Schottky-barrier, or metal-semiconductor diode, with the contacted region of the semiconductor layer 11. In the semiconductor layer 11 near the metal-semiconductor contact, the concentration of free electrons, i.e., the concentration of charge carriers, can be reduced in the order of several magnitudes compared with the concentration in the semiconductor layer 11 remote from the contact. As mentioned, the thickness $x$ of this depletion zone is controlled by the voltage applied to gate electrode G. The resistance of the current channel between electrodes Q and S reaches its maximum when $x$ equals $a$, i.e., the depletion zone extends through the entire semiconductor layer.

The required control voltage is of a polarity such that the metal-semiconductor diode is operated in its high resistance direction; the control is thus practically non-dissipative.

Figure 2:
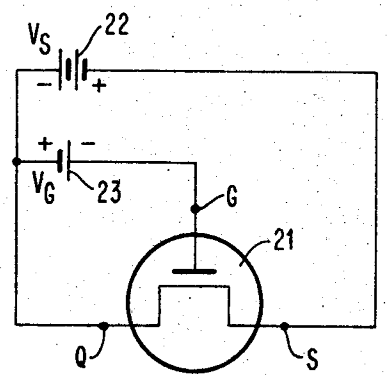
FIG. 2 is a diagram of a circuit including a field effect transistor according to FIG. 1 and the D-C voltages required for its operation.

FIG. 2 shows a field effect transistor 21 in a circuit arrangement which includes external D-C voltage sources 23 and 22 required for its operation, i.e., the gate voltage $V_G$ and the drain voltage $V_S$.

The cut-off frequency of a field effect transistor can be estimated from the time constant $\tau$ for the change of the carrier concentration in the contact zone. The equation for the time constant is:

$$\tau = C \cdot R \qquad (1)$$

The capacity C of the contact zone is given by the approximation formula:

$$C \sim \frac{\epsilon \cdot b \cdot L}{a} \qquad (2)$$

where $\epsilon$ is the dielectric constant, $a$ is the thickness of semiconductor layer, $b$ is the extension of field effect transistor orthogonal to plane of FIG. 1, and L is the width of gate electrode.

The ohmic resistance R of the current channel below the gate electrode G is given by the approximation equation:

$$R \sim \frac{L}{a \cdot b \cdot \sigma} \qquad (3)$$

where $\sigma$ is the conductivity of semiconductor material. From Equations 2 and 3, the time constant $\tau$ is given by the approximation equation:

$$\tau \sim \frac{\epsilon}{\sigma} \cdot \frac{L^2}{a^2} \qquad (4)$$

As it is preferable to reach maximum resistance of the current channel with the available control voltage, the value $a$ should be smaller or equal to the highest extension $x$ of the depletion zone obtainable with the control voltage, for example, $a = 1\mu$.

According to Equation 4, a very low time constant $\tau$ can be obtained for a given thickness $a$ if the gate electrode G is made very narrow and if the semiconductor layer 11 has a high conductivity which is proportional to the carrier mobility in the semiconductor material and to the carrier concentration. The carrier concentration can be influenced by suitably doping the semiconductor layer 11. Under these conditions, the cut-off frequency which theoretically can be obtained is in the order of 10–100 gigacycles.

Efforts were made to develop amplifiers having very high frequency operation which lead to the development of the so-called distributed amplifier of the vacuum tube art. Connecting several amplifier stages in a cascade produces no improvement if the amplification factor of a single stage decreases to a value less than unity for high frequency operation because the total amplification factor is equal to the product of the amplification factors of the single amplifiers.

In a distributed amplifier arrangement, the active elements, e.g. vacuum tubes, are arranged in parallel such that currents but not the self-capacitances are additive. In the resulting circuitry, the amplification factors of the single amplifiers are additive. The basic principle is to allow the grid and anode of the tubes to form input and output transmission lines. A signal applied to the input transmission line progresses through this line and in turn reaches the grid of all tubes. The resulting anode current divides in the output transmission line into two wave components, one of which progresses towards the output and the other backwards. The latter component is absorbed when the output transmission line is matched with an appropriate matching resistor. If the delay time per unit length, i.e., the speed of the wave progressing through the transmission line, is the same in both lines, the anode currents and, thereby, the amplification factors of all tubes add together. The total amplification factor for a distributed amplifier consisting of $n$ tubes is:

$$V_{total} = n \cdot v \cdot \frac{Z}{2} \qquad (5)$$

where $v$ is the single active element amplification factor, and Z is the characteristic impedance of output transmission line. With distributed amplifiers employing vacuum tubes, cut-off frequencies of about 500 megacycles can be reached.

Figure 3:
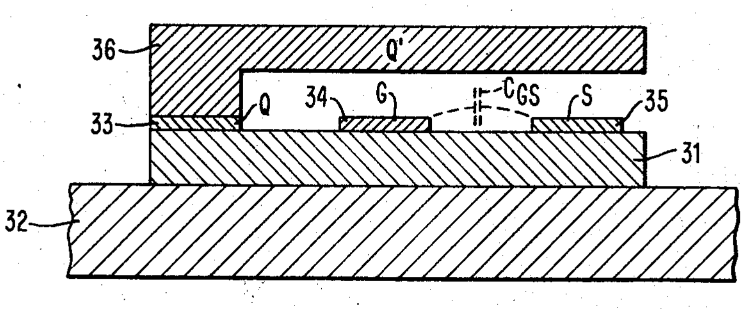
FIG. 3 is a cross-section of a transmission line amplifier.

The performance accomplished by such distributed amplifiers which also have been built with transistors is further improved by a transmission line amplifier as shown in FIG. 3. In a distributed amplifier, separate discrete active elements are used and the transmission lines are also formed by discrete elements, i.e., by capacitances and inductances. A transmission line amplifier can consist, for example, of a field effect transistor as shown in FIG. 1 which is considerably extended in the direction (dimension $b$) perpendicular to the current channel. Such a transmission line amplifier then consists, in fact, of an infinite number of transistor elements arranged in parallel whereas the input and output transmission lines are formed by the extended transistor electrodes as follows: the input transmission line by gate electrode G and the extended part Q′ of source electrode Q; the output transmission line by drain electrode S and the extended part Q′ of source electrodes Q. The active elements as well as the parameters of the transmission lines are thus perfectly distributed over length $b$ of the amplifier device. The essential requirements for a transmission line amplifier are similar to those for a distributed amplifier, i.e., the propagation speed must be equal on both transmission lines or, in other words, the signal on the input transmission line must be in phase with the signal on the output transmission line.

As mentioned, the transmission line amplifier shown in FIG. 3 consists essentially of a field effect transistor according to FIG. 1 which is extended perpendicular to the current channel. For the dimensions and materials of the semiconductor layer 31, the substrate 32 and the electrodes 33, 34 and 35, the same statements apply as those given in connection with FIG. 1, respectively. The extended source electrode Q′ is identified by number 36. In the embodiment shown, extension of electrode Q (Q′) is necessary in order to fulfill the requirement that phase velocities for the two transmission lines formed by the electrodes G and Q (Q′) and electrodes S and Q′, respectively, be equal. The free space between electrode Q′ on one side and electrodes G and S as well as the semiconductor layer 31 on the other side may be filled with insulating material, e.g., silicondioxide ($SiO_2$), not shown in FIG. 3. Between electrodes G and S, the gate-drain capacity $C_{GS}$ is indicated in dotted form; its significance and influence is explained later.

Figure 4:
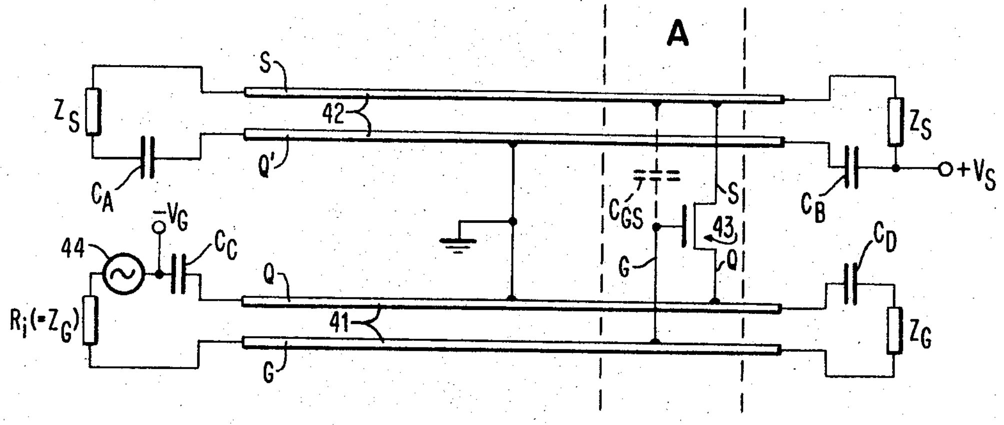
FIG. 4 is an equivalent circuit diagram for a transmission line amplifier according to FIG. 3.

FIG. 4 shows an equivalent circuit diagram of the transmission line amplifier illustrated in FIG. 3. Input transmission line 41 and output transmission line 42 formed by electrodes Q (Q′) and G, and Q′ and S, respectively, are represented by heavy lines. In section A, one of the transistor elements 43 is indicated schematically. The gate-drain capacity $C_{GS}$ is shown in dotted form. The input of transmission line 41 is connected to signal source 44 whose internal resistance $R_i$ is equal to the characteristic impedance $Z_G$ of the transmission line; at its opposite end the input line is matched with its characteristic impedance $Z_G$. The output transmission line 42 is matched with its characteristic impedance $Z_S$ at both sides, whereby the resistor $Z_S$ at the right end represents the load resistor. The two electrodes Q and Q′ are grounded while voltage sources $-V_G$ and $V_S$ supply necessary D-C voltages in accordance with the circuit shown in FIG. 2. The capacitors $C_A$ through $C_D$ are D-C blocking condensors and represent a short circuit for the high frequencies to be amplified.

Basically, the operation of such a transmission line amplifier corresponds to that of a distributed amplifier. For its application as microwave amplifier, it is an essential requirement that feedback via transistor capacity $C_{GS}$ is less than unity; otherwise the circuit would oscillate. This critical capacitance $C_{GS}$ is advantageously used in the microwave generator of the present invention. In the following, a preferred embodiment of such a generator is described based essentially on a transmission line amplifier.

Figure 5:
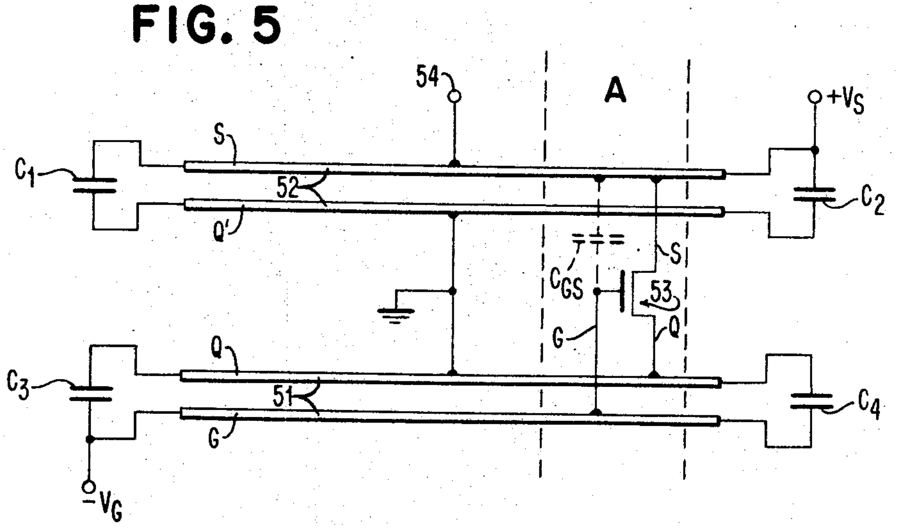
FIG. 5 is an equivalent circuit diagram for a microwave generator according to the invention.

FIG. 5 shows the electric equivalent circuit diagram of a microwave generator whose structure essentially corresponds to the arrangement shown in FIG. 3. The two transmission lines 51 and 52 are again formed by electrodes Q (Q′) and G, and Q′ and S, respectively. In section A, one of the transistor elements 53 is shown coupling the two transmission lines 51 and 52. Both transmission lines 51 and 52 are short-circuited for high frequencies through capacitors $C_1$ through $C_4$. The capacitors $C_1$ through $C_4$ are necessary to apply the required D-C voltages. The transmission lines 51 and 52 which are, contrary to the transmission line amplifier shown in FIG. 4, not matched with their characteristic impedances and serve as resonators whose functions are well known in the microwave technology. Electrodes G and Q (Q′) form the gate resonator, electrodes S and Q′ the drain resonator. As soon as the circuit starts oscillating, a voltage loop is built-up in the middle of the transmission lines forming the resonators, provided these are of suitable length; at this point, the highest A–C amplitude occurs. The voltage nodes occur at the short-circuited ends of the transmission lines where the amplitude equals zero. The length of the transmission lines, or resonators, is preferably equal to $\lambda/2$ whereby $\lambda$ is the desired wavelength of the microwave oscillations. The necessary D–C voltages for the operation of the generator are again indicated with $-V_G$ and $V_S$. The two resonators are coupled by the transistor which is extended perpendicular to the current channel. The active coupling couples power from the gate resonator with gain into the drain resonator. The power gain must exceed unity. In addition to this active coupling between the two resonators, there exists a passive coupling mainly by the gate-drain capacitance $C_{GS}$; however, there is also magnetic coupling. This passive coupling represents the feedback path of the oscillator.

Figure 6:
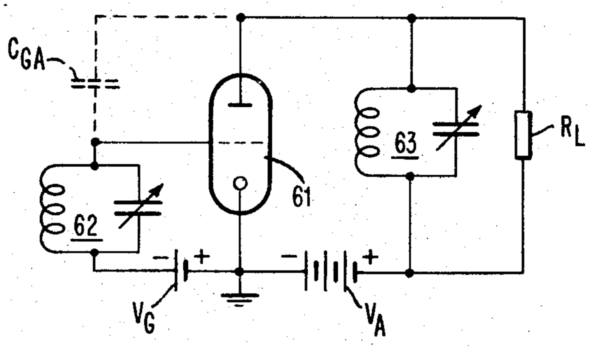
FIG. 6 is a circuit diagram of a tuned plate-tuned grid oscillator.

To understand the mode of operation, the well-known tuned plate-tuned grid oscillator shown in FIG. 6 is now considered. In this circuit, resonant circuits 62 and 63 are provided in both the plate and grid circuits of vacuum tube 61. These resonant circuits are tuned to approximately the same frequency. Feedback occurs via the gride-plate capacitance $C_{GA}$ as indicated by the dotted lines. In this circuit, oscillation occurs if the feedback is capacitive as provided by the capacitance $C_{GA}$, and if the grid resonator is slightly detuned inductively. This provides the necessary phase relation for feedback. The same conditions can be fulfilled in the microwave generator shown in FIG. 5. The transmission line forming the gate resonator must be slightly shorter than the drain transmission line. Furthermore, capacitive feedback must dominate; this is accomplished by capacitance $C_{GS}$.

As indicated above the length of the drain resonator preferably equals $\lambda/2$. Thus, the length for the slightly shorter gate resonator is $\lambda/2-\Delta 1$, whereby $\Delta 1$ is preferably $\leqq\lambda/4$. The value of $\Delta 1$ depends on the capacitive coupling between the gate and drain electrodes, i.e., the value of $C_{GS}$ and the magnetic coupling between the two transmission lines. A typical value for $\Delta 1$ is $\lambda/8$.

In the embodiment shown in FIG. 5, the microwave generator output is taken from tab 54 which is connected with the center of the drain resonator formed by electrodes S and Q′, i.e., at that point where the voltage maximum occurs.

Figure 7A:
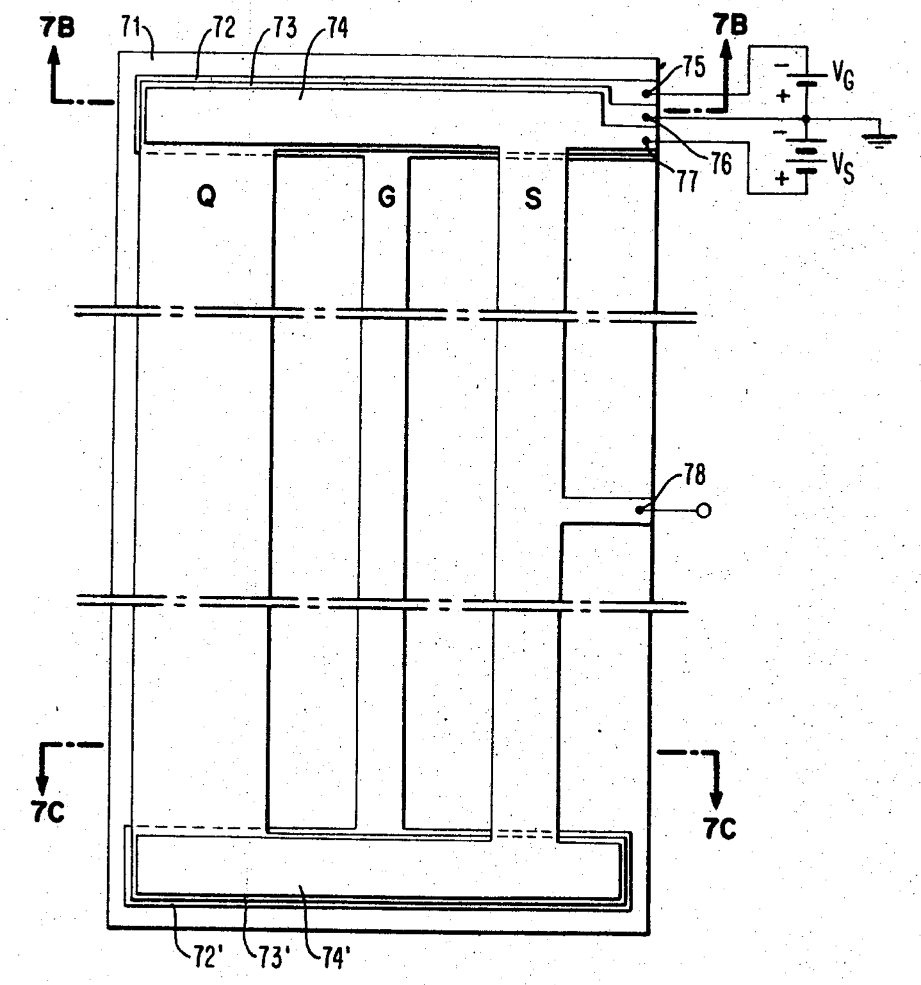
FIG. 7A is a top view and FIGS. 7B and 7C are cross-sectional views of a microwave generator according to the present invention.

FIG. 7A, shows a top view of a preferred embodiment of the microwave generator. A thin semiconductor layer 71 of *n*-type material arranged on a substrate, not shown, layer 71 can be formed of GaAS having the thickness of approximately $1\mu$. Preferably, semiconductor materials are used wherein the majority carriers have a high mobility, for example, GaAs, InSd. However, Si and Ge can also be used. For deposition of the semiconductor layer 71 onto the substrate, an epitaxy-method can be used to provide a monocrystalline semiconductor film. In this case, the substrate should consist preferably of the same semiconductor material; however, other crystals may be used provided their lattice structure is at least similar to the structure of the semiconductor to be deposited. An example for such a crystal is sapphire ($Al_2O_3$). Electrodes Q, G and S are deposited onto the semiconductor layer by evaporation techniques.

As mentioned, electrodes Q and S must form an ohmic contact with the semiconductor layer 71; aluminium is a suitable metal. Contrary to that, the gate electrode G must, together with the semiconductor layer 71, form a metal-semiconductor diode; if GaAs is used as semiconductor material, gold or molybdenum are suitable metals for the gate electrode G. The required extension Q′ of the gate electrode (FIG. 3) which is placed above electrodes G and S and separated from them by an insulating material, for example, $SiO_2$, is not shown in FIG. 7A. At their ends, the electrodes are enlarged to plates arranged on top of each other (72, 73, 74 at the upper end, 72′, 73′, 74′ at the lower end); these plates form blocking capacitors $C_1$ through $C_4$ shown in FIG. 6 which provide a short circuit for high frequencies at the ends of the resonators. Three of those plates are arranged on top of each other at both ends of the device. They are separated by an insulating layer, not shown in FIG. 7A. In order to more clearly show the arrangement of these plates, they are shown in slightly different sizes. Plates 72 and 73 form capacitor $C_3$, plates 73 and 74, capacitor $C_1$. The plates shown at the lower end of the drawing form the capacitors $C_2$ and $C_4$, respectively. Tabs 75, 76 and 77 are provided whereat voltages are applied. Tabs 75 and 76 of the gate and source electrodes G and Q, respectively, are connected across voltage source $V_G$; tabs 76 and 77 of the source and drain electrodes Q and S, respectively, are connected across voltage source $V_S$. An output tab 78 is connected to the drain resonator formed by electrodes S and Q′. The circuit corresponds to the diagram shown in FIG. 5.

Figure 7B:
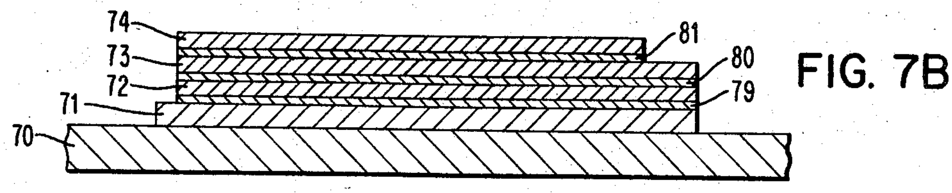

In FIG. 7B taken along line A—A of FIG. 7A, the semiconductor layer, and the condenser plates are designated by numbers 70, 71, 72, 73, 74, respectively. The insulating layers, e.g., of $SiO_2$, separating the condenser plates are indicated by 79, 80 and 81.

Figure 7C:
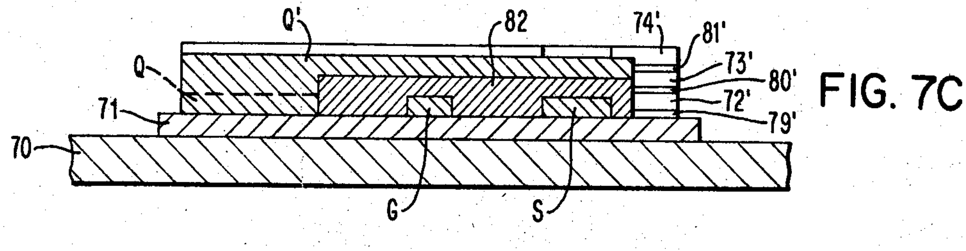

In FIG. 7C taken along line B—B of FIG. 7A, the

6. A microwave generator as defined in claim 2 wherein substrate and semiconductor layer are again designated by numbers 70 and 71, respectively. The electrodes are indicated by Q, Q', G and S. A layer 82, of insulating material, e.g., $SiO_2$, fills the space below electrode Q'. The condenser plates, shown at the lower end of FIG. 7A, are again designated by 72', 73', and 74'. These condenser plates are separated by insulating layers 79', 80' and 81'.

Referring to FIGS. 5 and 7A–C, the conditions necessary for oscillations are:

$$S \cdot Z > 1 \quad (6)$$

where S is the transconductance, and Z is the characteristic impedance of output transmission line.

The theoretical maximum of transconductance S can be calculated from the equation:

$$S = \frac{a \cdot b \cdot \sigma}{L} \quad (7)$$

where $a$ is the thickness of semiconductor layer 71, $b$ is the extension of semiconductor layer perpendicular to current paths, $\sigma$ is the conductivity of semiconductor material, and L is the width of gate electrode.

Typical values quite easily obtainable with modern production methods are:

$$a = 1\mu$$

$$b = 2 \text{ mm.}$$

$$\sigma = 1 \frac{1}{\Omega \text{ cm.}}$$

$$L = 10\mu$$

With these values substituted in Equation 7, the transconductance $$S \text{ is equal to } 20 \frac{\text{ma.}}{\text{V}}$$

A further reduction of width L of the gate electrode to, for example, $2\mu$ would result in a transconductance $$S \text{ equal to } 100 \frac{\text{ma.}}{\text{V}}$$

Such small dimensions can also be obtained by using modern methods like photo-etching or electron beam milling.

The characteristic impedance Z of the transmission line formed by electrodes S and Q' is approximately given by $$Z = \frac{120 \cdot \pi}{\sqrt{\epsilon}} \cdot \frac{d}{w} \quad (8)$$

where $\epsilon$ is the dielectric constant of insulating material between the electrodes, e.g., approximately 4.2 for $SiO_2$; $d$ is the distance between electrodes, and $w$ is the width of electrode S. With $d=10\mu$ and $w=20\mu$ and with $SiO_2$, the characteristic impedance $\tau$ is approximately 100Ω. These rough calculations show that the requirement $S \cdot Z > 1$ can be achieved quite easily.

As mentioned, the frequency is determined by the length of the transmission lines of the respective resonators. For a high frequency microwave generator, the same requirements must be met as those given for the field effect transistor shown in FIG. 1. These requirements are contained in Equation 4 for the time constant $\tau$, i.e., $\epsilon$ and L must be small as they are inversely proportional to the cut-off frequency; on the other hand, the conductivity $\sigma$ and the thickness $a$ of the semiconductor material must be high as these are directly proportional to the cut-off frequency. When these requirements are taken into account, microwave frequencies corresponding to millimeter waves can be obtained.

The efficiency which can be achieved with the described microwave generator is about 20% to 30% which is high compared to that of other microwave generators. This favorable efficiency is mainly due to the fact that the microwave generator consists of reactances resulting in a very low D-C power consumption.

The microwave generator has been explained by using a preferred embodiment based on a field effect transistor including a Schottky-barrier, or semiconductor-metal diode, gate electrode. Other types of transistors may be used as well, e.g., the so-called MOS, or insulated-gate field effect transistor wherein the gate electrode is separated from the semiconductor sample by an insulating layer. When the dimensions and materials, which have been indicated in connection with the preferred embodiment, are changed, the microwave generator characteristics, e.g., frequency or wavelength, may be changed in accordance with the requirements of the particular application.

While the invention has been particularly shown and described with reference to preferred embodiments thereof, it will be understood by those skilled in the art that the various changes in form and details may be made therein without departing from the spirit and scope of the invention.

What is claimed is:

1. A microwave generator comprising:
a field effect transistor including
source and drain electrodes conductively connected to a layer of semiconductor material of a given conductivity type,
current source means connected to said source and drain electrodes,
gating means for modulating current conduction between said source and drain electrodes including a gate voltage source means and gate electrode means proximate to said layer of said semiconductor material for establishing a field effect gate region in said semiconductor layer;
first and second resonant transmission line means including said source and gate electrodes and said source and drain electrodes, respectively;
means for capacitive coupling of said first and second resonant means to support the generation of microwave oscillations therein; and
output means connected to said resonant means.

2. A microwave generator comprising:
a field effect transistor including
elongated source and drain electrodes arranged in substantially parallel fashion and conductively connected to a layer of semiconductor material of given conductivity type,
current source means connected to said source and drain electrodes,
gating means for modulating current conduction between said source and drain electrodes along said semiconductor layer including a gate voltage source means and gate electrode means proximate to said layer of said semiconductor material for establishing a field effect gate region in said semiconductor layer;
input and output transmission lines defined by said source electrode being extended to pass over said gate and drain electrodes, respectively, the length of said output transmission line being slightly in excess of the length of said input transmission line and exhibiting a same phase velocity as said input transmission line; and
output means connected to said output transmission line.

3. A microwave generator as defined in claim 2 wherein length of said output line is $\lambda/8$ longer than said input transmission line where $\lambda$ is the wave length of microwave current oscillations to be generated.

4. A microwave generator as defined in claim 2 wherein said gate electrode comprises a metallic layer in contact with said layer of semiconductor material and defining a Schottky-barrier therewith.

5. A microwave generator as defined in claim 2 wherein said layer of semiconductor material is selected from a group consisting of silicon, germanium, indium-phosphide and GaAs.

said source and drain electrodes are formed of aluminum and said gate electrode is formed of gold.

7. A microwave generator comprising:
a field effect transistor structure including
elongated source and drain electrodes arranged in substantially parallel fashion and conductively connected to a layer of semiconductor material of a given conductivity type supported on a high resistivity substrate,
current source means connected to said source and drain electrodes,
gating means for modulating current conduction between said source and drain electrodes and along said layer of semiconductive material including a gate voltage source means and gate electrode means proximate to said layer of said semiconductor material for establishing a field effect gate region in said semiconductor layer;
input transmission line means including said source electrode and said gate electrode; and
output transmission line means including said source electrode and said drain electrode, the product of the transconductance of said field effect transistor and characteristic impedance of said output transmission line being greater than unity,
said input and output transmission line means being capacitively shorted at each end to define input and output resonator means, and
said input and output resonator means being coupled by the gate-drain capacitance of said field effect transistor to support the generation of microwave oscillations.

8. A microwave generator comprising:
a thin layer of semiconductive material of a given conductivity type formed on a high resistivity monocrystalline semiconductor substrate,
metallic source and drain electrodes defining respective ohmic contact with said layer of semiconductor material,
metallic gate electrode means formed over said layer of semiconductor material intermediate between said source and drain electrodes and defining a rectifying contact therewith,
current source means connected to said source and drain electrodes,
voltage biasing means connected to said gate electrode for modulating current along said layer of semiconductive material and between said source and drain electrodes, first and second transmission line resonant means including said source and gate electrodes and said source and drain electrodes, respectively, and being capacitively coupled along the gate-drain capacitance of said field effect transistor,
said field effect transistor exhibiting a power gain between said first to said second resonant means greater than unity, and
output means connected to said second resonant means.

9. A microwave generator as defined in claim 8 wherein
said source, drain, and gate electrodes are formed on a same surface of said layer of semiconductor material, and
said source electrode being extended to pass over said gate and drain electrodes in insulated relationship thereto to define said first and second resonant means, respectively.

10. A microwave generator as defined in claim 8 wherein
said source, gate and drain electrodes are formed in substantially parallel fashion on said layer of semiconductive material,
said source electrode being extended to pass over said gate and drain electrodes in insulated relationship thereto to define input and output transmission lines, respectively, and
said source, gate and drain electrodes being terminated at each end in plate-like extensions which are superimposed with relationship to each other in insulated fashion whereby said input and output transmission lines are shorted by capacitive coupling to define said first and second resonant means.

11. A microwave generator as defined in claim 8 wherein said layer of semiconductive material is selected from the class consisting of GaAs, InP, Si and Ge.

References Cited

UNITED STATES PATENTS

| | | | |
|---|---|---|---|
| 3,290,613 | 12/1966 | Theriault | 331—117 |
| 3,378,738 | 4/1968 | McIver | 317—235 |

OTHER REFERENCES

Electronic Design, p. 62, Oct. 25, 1966.

JOHN KOMINSKI, Primary Examiner

U.S. Cl. X.R.

317—235; 330—38; 331—99